US009305753B2

(12) United States Patent
Jensen et al.

(10) Patent No.: US 9,305,753 B2
(45) Date of Patent: Apr. 5, 2016

(54) THICKNESS CHANGE MONITOR WAFER FOR IN SITU FILM THICKNESS MONITORING

(71) Applicant: KLA-Tencor Corporation, Milpitas, CA (US)

(72) Inventors: Earl Jensen, Santa Clara, CA (US); Kevin O'Brien, Menlo Park, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 11 days.

(21) Appl. No.: 14/195,390

(22) Filed: Mar. 3, 2014

(65) Prior Publication Data
US 2014/0253928 A1 Sep. 11, 2014

Related U.S. Application Data

(60) Provisional application No. 61/773,318, filed on Mar. 6, 2013.

(51) Int. Cl.
*G01B 11/02* (2006.01)
*H01J 37/32* (2006.01)
*G01B 11/06* (2006.01)

(52) U.S. Cl.
CPC ....... *H01J 37/32935* (2013.01); *G01B 11/0625* (2013.01); *G01B 11/0675* (2013.01); *G01B 11/0683* (2013.01); *H01J 37/32972* (2013.01)

(58) Field of Classification Search
CPC ...... G01B 11/0675; G01B 9/02; G01B 11/06; G01B 11/0625; G01B 11/0683

USPC ......................................................... 356/503
See application file for complete search history.

(56) References Cited

U.S. PATENT DOCUMENTS

2002/0093648 A1* 7/2002 Nikoonahad et al. ...... 356/237.1
2003/0133127 A1 7/2003 Zaidi et al.
(Continued)

FOREIGN PATENT DOCUMENTS

KR 20120024571 A 3/2012

OTHER PUBLICATIONS

International Search Report and Written Opinion for International Application No. PCT/US2014/021289, mailed Jun. 19, 2014.
(Continued)

*Primary Examiner* — Hoa Q. Pham
*Assistant Examiner* — Md M Rahman
(74) *Attorney, Agent, or Firm* — Joshua D. Isenberg; JDI Patent

(57) ABSTRACT

An etch rate monitor apparatus has a substrate, an optical element and one or more optical detectors mounted to a common substrate with the one or more detectors sandwiched between the substrate and optical element to detect changes in optical interference signal resulting from changes in optical thickness of the optical element. The optical element is made of a material that allows transmission of light of a wavelength of interest. A reference waveform and data waveform can be collected with the apparatus and cross-correlated to determine a thickness change. This abstract is provided to comply with rules requiring an abstract that will allow a searcher or other reader to quickly ascertain the subject matter of the technical disclosure. It is submitted with the understanding that it will not be used to interpret or limit the scope or meaning of the claims.

26 Claims, 3 Drawing Sheets

(56) References Cited

U.S. PATENT DOCUMENTS

| | | | |
|---|---|---|---|
| 2003/0224262 A1* | 12/2003 | Lof et al. | 430/22 |
| 2004/0040930 A1 | 3/2004 | Tanaka et al. | |
| 2007/0249071 A1* | 10/2007 | Lian et al. | 438/16 |
| 2007/0251339 A1* | 11/2007 | Wiese et al. | 73/866.1 |
| 2008/0088587 A1* | 4/2008 | Pryor | 345/158 |
| 2008/0216956 A1* | 9/2008 | Nakamoto et al. | 156/345.25 |
| 2008/0261335 A1* | 10/2008 | Grimbergen | 438/9 |
| 2009/0128829 A1* | 5/2009 | Schillke et al. | 356/521 |
| 2010/0128280 A1* | 5/2010 | Davidson et al. | 356/497 |
| 2012/0015460 A1 | 1/2012 | Donaher | |
| 2012/0035863 A1 | 2/2012 | Kuwabara | |
| 2012/0091550 A1* | 4/2012 | Morgan et al. | 257/432 |
| 2012/0291952 A1 | 11/2012 | Davis et al. | |
| 2012/0318966 A1* | 12/2012 | Jensen et al. | 250/227.23 |
| 2013/0155390 A1* | 6/2013 | Jensen et al. | 356/72 |

OTHER PUBLICATIONS

U.S. Appl. No. 61/773,318, to Earl Jensen, filed Mar. 6, 2013.

* cited by examiner

THICKNESS CHANGE MONITOR WAFER FOR IN SITU FILM THICKNESS MONITORING

CLAIM OF PRIORITY

This application is a nonprovisional of and claims the priority benefit of commonly owned, co-pending U.S. Provisional Patent Application No. 61/773,318, to Earl Jensen et al., filed Mar. 6, 2013, and entitled "THICKNESS CHANGE MONITOR WAFER FOR IN SITU FILM THICKNESS MONITORING" the entire disclosures of which are incorporated herein by reference.

FIELD OF THE INVENTION

Embodiments of the present invention relate to plasma processing and more particularly to measuring etch rate in situ in a plasma processing chamber.

BACKGROUND

The current use of Etch Rate Monitor Wafers (ERMW), while inexpensive and well known, is a cumbersome technique to debug a recipe with a series of etch conditions. In current best known practices film thickness is measured on a wafer before and after processing. The etch rate is inferred as the thickness change against the perceived etch-step time(s) and thus measures an integral of all the material removed. While the current method provides for very detail and accurate maps, it does not give insight as to at what step the etch really took place. Furthermore, modern etch recipes may contain up to a dozen etch steps that all interact to give the composite etch profile. To debug this using an ERMW may take many runs using a divide and conquer strategy. This is expensive and time consuming.

It is within this context that aspects of the present disclosure arise.

SUMMARY

According to an aspect of the present disclosure, an apparatus may include an optical film thickness monitor having an optical element and one or more detectors on a common substrate. The one or more detectors are sandwiched between the substrate and the optical element and configured to detect optical interference signal changes resulting from changes in optical thickness of the optical element.

In some implementations, the one or more detectors may include a plurality of such detectors.

The plurality of detectors may in the form of a linear optical sensor array.

The apparatus may include a computer system configured to process a data signal from the linear optical sensor array against a reference signal from the linear optical sensor array such to create an autocorrelation function that may be processed to further relate data signal to an optical phase shift.

An external data processing unit may analyze the autocorrelation function to generate uniformity maps as a function of time.

The apparatus may optionally include an aperture limiting device.

The apparatus may optionally include a wavelength limiting device configured such that only light having wavelengths in a range of interest is allowed to pass through to the one or more detectors.

In some implementations, the optical element may include a wedge of sacrificial material that transmits light in a wavelength range of interest.

In some implementations, the optical element may include a slab-shaped window configured to provide a, beam splitter, a measurement arm and a reference arm of an interferometer. The interferometer may further include partially reflecting mirrors on opposite sides of the window. The interferometer may include an optical filter on one side of the window. The optical filter may be configured such that some light may pass through the window to the detector without passing through the filter.

The apparatus may be configured to use an external environment as a light source for the interference signal.

The external environment may include a plasma that acts as the light source.

In some implementations the plurality of sensors may include three or more sensors.

The three or more sensors may include one sensor located at a center of the substrate, one sensor located at a mid-radius of the substrate and edge.

The sensors may be sandwiched between first and second semiconductor wafers to provide noise isolation.

The one or more sensors are configured to communicate wirelessly with a computing system.

A method may involve obtaining a reference waveform and data waveform from an etch rate monitor apparatus, cross-correlating the data waveform with the reference waveform; and determining thickness change from the cross-correlating of the data with the reference waveform. The etch rate monitor apparatus can have a substrate, an optical element provided over the substrate and a detector sandwiched between the substrate and the optical element. The optical element is made of a material that allows transmission of a wavelength of interest and wherein the detector includes an array of sensors for collecting light passing through the optical element.

BRIEF DESCRIPTION OF THE DRAWINGS

Objects and advantages of the invention will become apparent upon reading the following detailed description and upon reference to the accompanying drawings in which.

DETAILED DESCRIPTION

In the following Detailed Description, reference is made to the accompanying drawings, which form a part hereof, and in which is shown by way of illustration specific embodiments in which the invention may be practiced. The drawings show illustrations in accordance with examples of embodiments, which are also referred to herein as "examples". The drawings are described in enough detail to enable those skilled in the art to practice the present subject matter. Because components of embodiments of the present invention can be positioned in a number of different orientations, directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

Aspects of the present disclosure relate to an apparatus and method for measuring changes in film thickness in situ in a plasma processing chamber. The purpose for this apparatus is to measure etch rate in situ in a plasma processing chamber. Conversely, deposition rate can also be measured, particularly in applications where the deposited material is optically identical or at least very close to the material of the monitor window. This is useful for diagnostic purpose when a plasma processing equipment original equipment manufacturer (OEM) or a semiconductor manufacturing end user, wishes to troubleshoot a process recipe. Aspects of the present disclosure may be implemented to monitor a di-electrical etch condition where material is removed (film is getting thinner). The wafer may be data acquisition instrument in nature and would emit its data at the end of a trial (mission), where an off-line application could analyze this data to present spatial and time-resolved contour maps.

Aspects of the present disclosure differ from the current best known practices where film thickness is measured on a wafer before and after processing.

Figure 1:
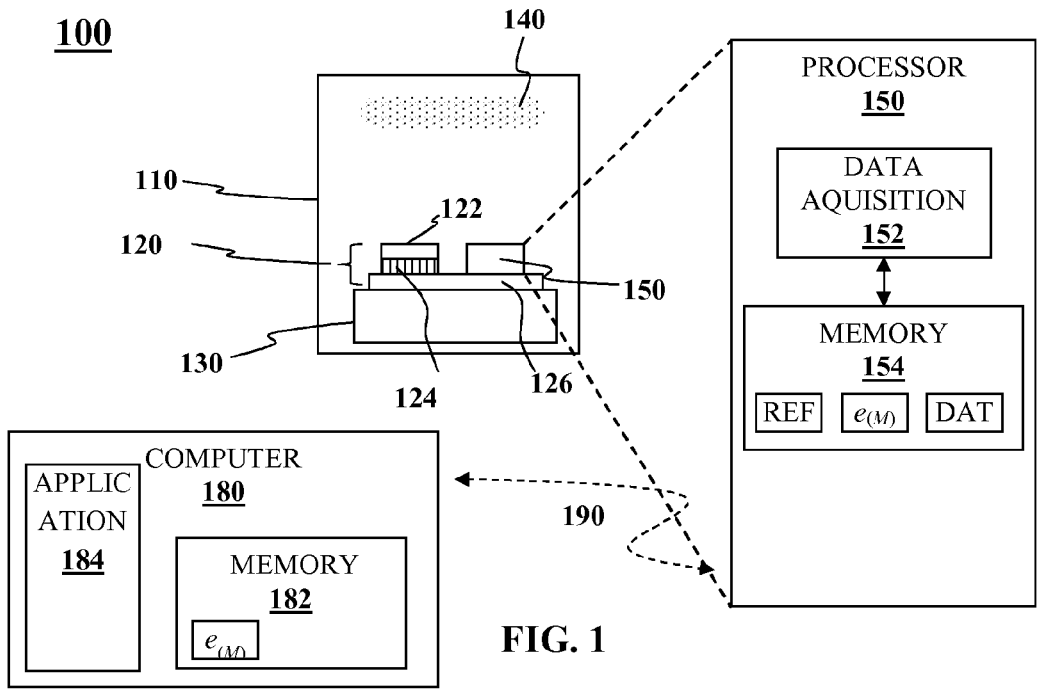
FIG. 1 is a block diagram illustrating a system in which aspects of the present disclosure may be implemented.
Figure 3A:
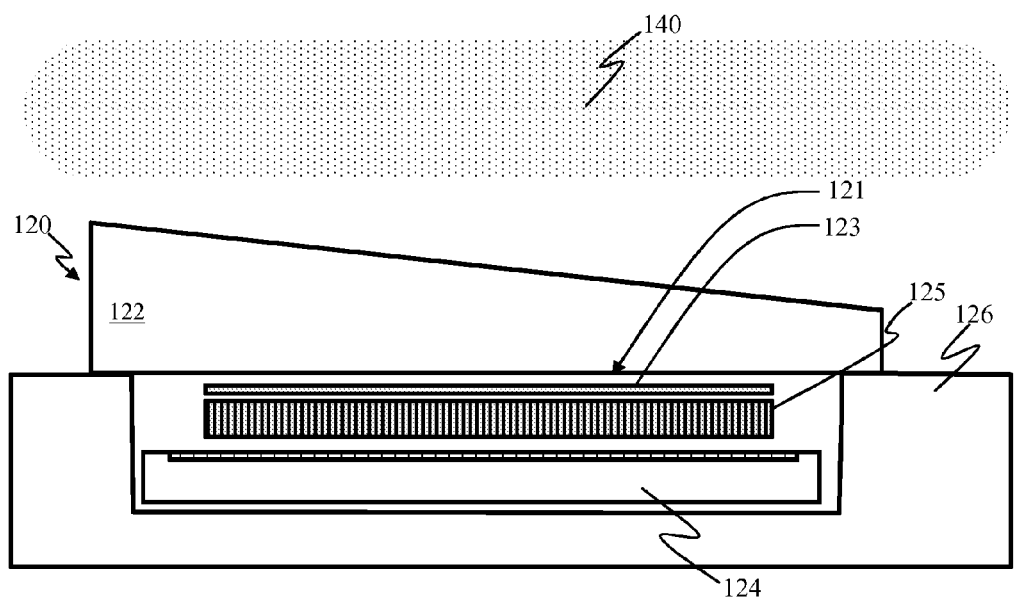
FIG. 3A is a schematic diagram of an example of an apparatus according to an aspect of the present disclosure.
Figure 4A:
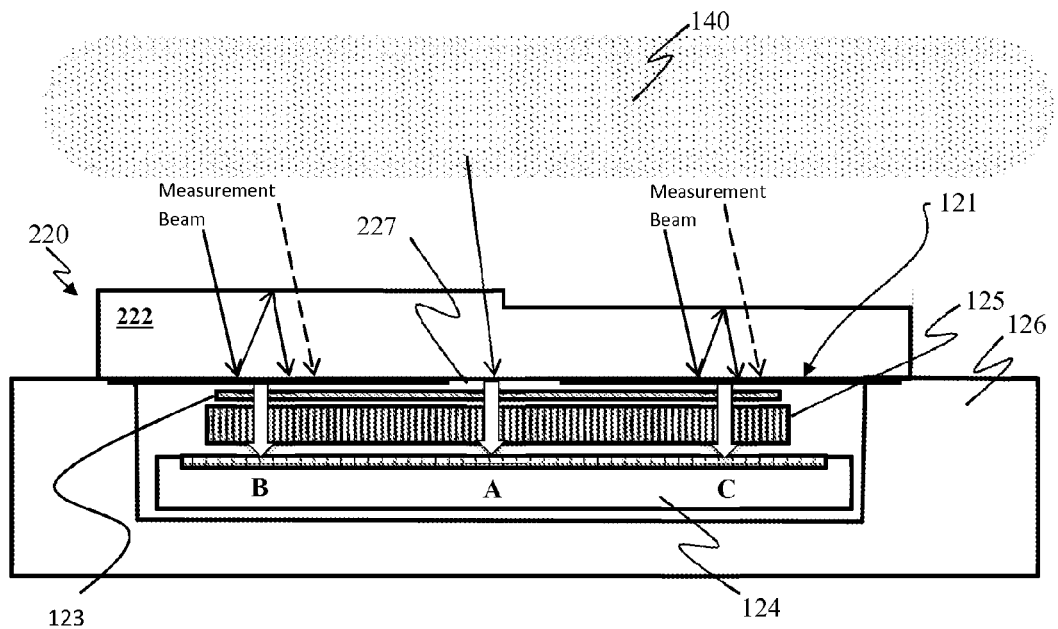
FIG. 4A is a schematic diagram of an example of an alternative apparatus according to an aspect of the present disclosure.

FIG. 1 illustrates a system 100 in which aspects of the present disclosure may be implemented. The system 100 generally includes an apparatus 120 enclosed in a plasma processing chamber 110 and a data processing unit 150 coupled to the apparatus 120. An illumination source 140 is provided in the chamber 110 for providing Lambertian, incoherent illumination. In one example, the illumination source 140 is plasma. In addition, a chuck or holding stage 130 may be provided for supporting or holding the apparatus 120. The apparatus 120 may include an optical element 122, one or more optical sensors 124 and a substrate 126. The data processing unit 150 may be located on the substrate 126 as part of the apparatus 120. Specifically, the optical element 122 may be made of a material that allows transmission of the wavelength of interest. The optical element may have a known thickness variation. By way of example and not by way of limitation, the optical element 122 may be a dielectrical wedge as shown in FIG. 3A or a transparent windows as shown in FIG. 4A. The one or more optical detectors 124 may include an array of sensors (e.g., a linear array) for sensing optical signals passing through the optical element 122. Coupled to the apparatus 120, the data processing unit 150, such as a computer or processor, includes an data acquisition application 152 that would process and analyze the data collected from the apparatus 120 to develop and obtain a spatial and time-resolved contour map. The data processing unit 150 may be coupled to the one or more optical detectors 124. The data processing unit 150 may further include a memory 154 to store data collected from the apparatus 120 (such as reference waveforms REF and error term $e_{(M)}$) for further processing.

A computer 180 running an off-line application may be coupled to the data processor unit 150, e.g., by a wireless link 190, to download a stored data session ($e_{(M)}$) for processing the data. It is noted that the functions of the computer data processor unit 150 and the 180 may be combined into one or more data processors.

Figure 2:
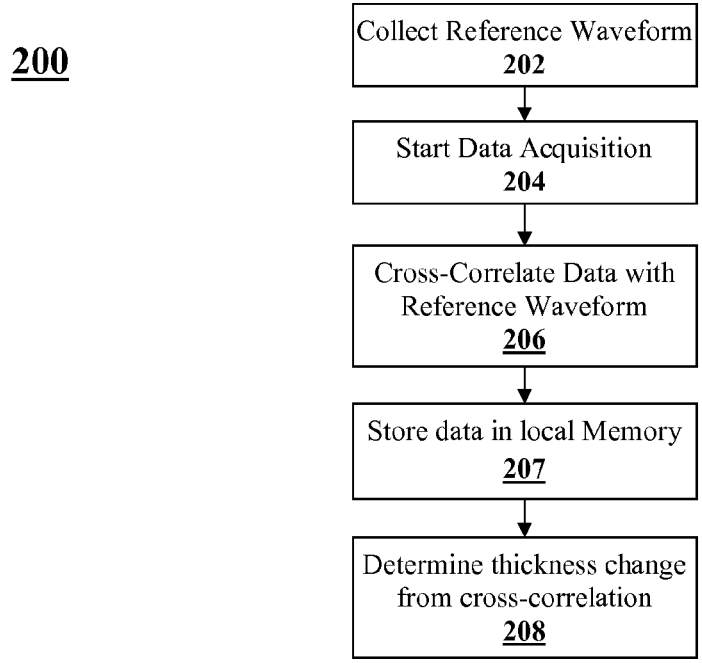
FIG. 2 is a flow diagram illustrating an example of a method for monitoring film thickness changes during a mission according to aspects of the present disclosure.

The flow diagram shown in FIG. 2 illustrates an example of a method for monitoring film thickness changes during a mission according to aspects of the present disclosure.

After the mission is started but before any etching (or deposition) starts, a reference waveform REF is collected, as indicated at 202. Multiple waveforms may be collected and averaged to reduce noise. This is the reference signal. Data acquisition then starts, as indicated at 204. The data set DAT under consideration is cross correlated with the reference waveform REF as indicated at 206 and the correlation is noted for several offsets. In some implementations, to save memory, power and numerical precision, only the intermediate results are stored in memory. This is shown in 207 in which data is stored into local memory for later retrieval. Specifically, if $R_{(n)}$ is the intensity reading on pixel, n, in the reference waveform, $PR_{(n)}$ is the intensity reading on pixel, n, in the current frame, N is the position in the array for which the data is processed and M is the offset of the reference to the currently measured waveform. Error terms $e_{(M)}$ of a correlation matrix may be evaluated by a non-normalized correlation, e.g., as follows:

$$e_{(M)} = \sum_{n=1}^{N-M} (R_n - P_{n-M})^2$$

Alternatively a linear version of $e_{(M)}$ could be used as follows:

$$e_{(M)} = \sum_{n=1}^{N-M} |R_n - P_{n-M}|$$

The $e_{(M)}$ may be stored as integers into the memory 154, e.g., for M=-4,-3 . . . 3,4.

Changes in thickness of the optical element 122 may be determined from the cross-correlation, as indicated at 208. For example, after the mission, the function $e_{(M)}$ at each sample interval and each sensor location may be uploaded to a Computer 180 as well as the reference waveform REF, one for each sensor location. Each set of $e_{(M)}$ may follow a parabola with a maxima at the pixel position that corresponds to the phase shift between reference and measurement. This maximum can be found by the application 184 and stored in the memory 182. The exact interference period is found from the reference interferogram (again for each sensor) and the respective accumulative phase shift is compensated for wavelength and respective pixel resolution. The result may be plotted as removed or deposited material (or etch or deposition rate in nm/sec) as contour maps.

It is noted that calculating the error terms $e_{(M)}$ using a non-normalized correlation is computationally less intensive compared to a normalized correlation that includes a normalization factor. The correlation does not need to be normalized to find a maxima in the correlation matrix, as in the preceding example.

Figure 3B:
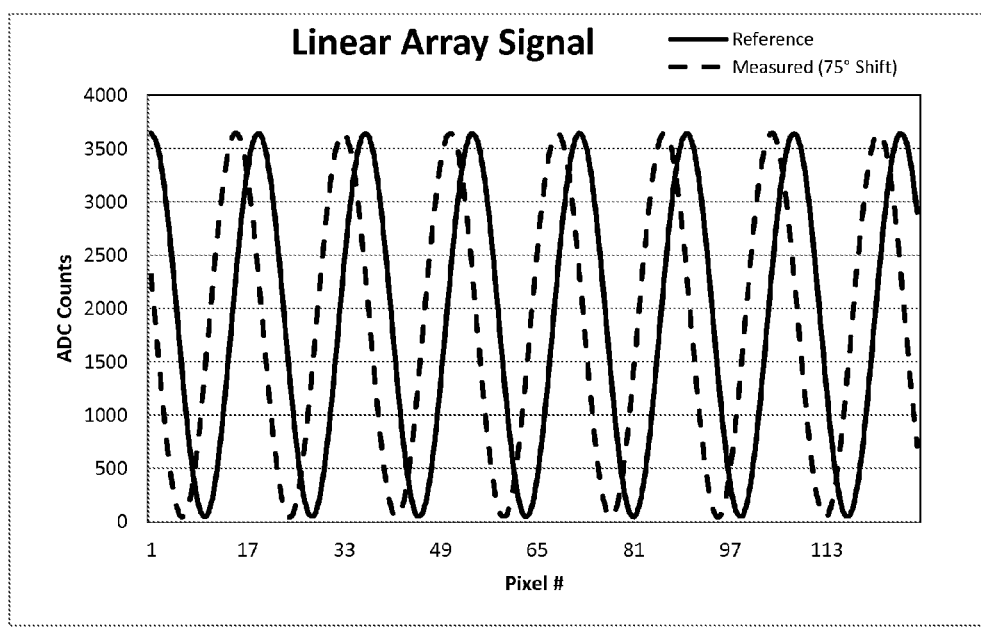
FIG. 3B is a graph showing the signal output from the apparatus of FIG. 3A.

FIG. 3A is a schematic diagram of an example of an apparatus 120 according to an aspect of the present disclosure. As shown in FIG. 3A, an optical element 122 and a linear detector 124 are provided over a substrate 126. In addition, a partial mirror 121, a filter 123 and a collimator 125 are provided between the optical element 122 and the linear detector 124. The half mirror or a partially mirrored surface 121 is deposited on the side towards the sensor array of the linear detector 124 to increase the contrast if the interference pattern. The filter 123 is a wavelength limiting device that allows only the wavelengths in the range of interest to pass through. The collimator 125 is configured to reject the non-normal rays or radiation received through the filter 123. With such configuration, the Lambertian, incoherent illumination (e.g., plasma) from the source 140 constructively and destructively interferes upon passing through a wedge-shaped optical element 122 due to optical path length differences between the transmitted and reflected light paths. In addition, the optical output from the optical element 122 is spectrally and angularly discriminated by the filter 123 and the collimator 125. The resulting fringes would result in a sine wave across the linear detector 124 given that the optical element 122 with a constant slope as shown in FIG. 3B.

The assumption is that over the dimension of the linear array sensor (~10 mm), the etch removal rate would be essentially uniform. This uniform thickness change, results in the fringes "walking" across the array as a function of time. This is called a phase shift and hence a fringe that has shifted an entire cycle would correspond to an optical path length change of one wavelength of the light that the filter 123 is set for, i.e. one half wavelength thickness of material removed. Measuring relative phase shift is a very robust technique that cancels many errors and offers increased sensitivity to thickness change. From simulation it appears that the shift can be measured and resolved down below 3°. At a 704 nm wavelength this corresponds to about 4 nm and can be collected every second. This is contrasted against measuring the interference in a flat slab, which incidentally is not perfect (1/10 wave) and is not expected to stay that flat as a result of the etch process. Measuring on a flat slab is a challenging measurement and measuring anything better than a quarter wavelength is difficult (176 nm for a 704 nm interrogation wavelength). Surprisingly, simulations suggest that 7-15 fringes that would appear across the array, is optimum and furthermore that a better fit results if there are more pixels. In one simulation 7 fringes and 128 pixels were used. With 10 fringes and a 704 nm wavelength the slope of the wedge 122 would be only 3 microns (μm) in 10 millimeters (mm) and is not noticeable to either the user or the process. The wedge need not be perfectly sloping, nor does it need to be linear as the method relies in finding the phase relationship from the reference. Sinusoidal non-linearity would be compensated for, if not outright eliminated. It is noted that an alternate optical construction may be the classical four-arm interferometer, reconfigured to be of a thin profile.

FIG. 4A is a schematic diagram of an example of an alternative apparatus according to an aspect of the present disclosure. In FIG. 4A, for the sake of simplicity, the same reference numerals will be given to elements having the same functions that correspond to elements in the embodiment of FIG. 3A, and redundant descriptions thereof omitted. In FIG. 4A, signal detection may be made with a transparent windows or slabs of glass 222. This embodiment is based on on-axis interferometry. In the on-axis interferometer at the plane of detection (photo diode), a slab of glass 222 is used as a beam splitter, a reference arm and a measurement arm. Note that the beams in FIG. 4A are shown at an angle for clarity.

It is noted that the reference and the measurement beam may not be of equal magnitude and hence the contrast of the interference may be greatly reduced. For λ in, the maximum contrast that can be expected is;

$$\frac{Imeasurement}{Ireference} = \frac{Iin \times 0.96 \times 0.99 \times 0.04 \times 0.01}{Iin \times 0.96 \times 0.01} \cong 4\%.$$

Minima or maxima can be expected for every λ/2 thickness change of the slab-shaped window 222. It is expected that the apparatus can resolve half of that, e.g., 175 nm at λ=700 nm. In some embodiments, a single slab 222 may be used. A detector array 124 measures optical interference as portions of the slab 222 are etched.

A intensity reference waveform can be collected by part of the detector array 124 through an area 227 not covered by a partial mirror 121. The intensity reference waveform may be used as a reference to subtract a majority of the bias and leave only the interference behind.

A step may be fabricated into the window 222 thus creating a second interference that is similar to the first trace but delayed in phase correlating to the thickness change as long as the etching processes at uniform rates across the slab 222. Indeed, many such steps may be present in the window 222, each presenting an interference signature. If the interference pattern in approximately 90° out of step, a quadrature algorithm may be employed for each pair of interferences and direction (etch versus deposition) as well as rate may be determined for each 90° of phase change. That would be about 88 nm per second if data was acquired once a second. With more step-pairs a finer sub division can be had albeit this would arguably be noisier compared to the embodiment of FIG. 3A.

Figure 4B:
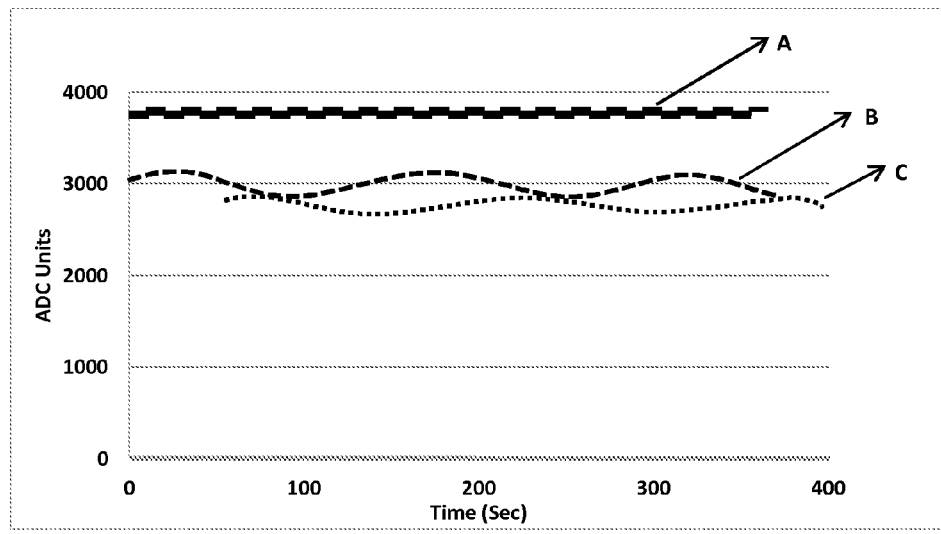
FIG. 4B is a graph showing the signal output from the apparatus of FIG. 4A.

FIG. 4B is a graph showing the signal output from the apparatus of FIG. 4A. Line A represents a reference waveform REF. Lines B and C represent measured waveforms.

A number of variations on the examples described are possible. For example, in some implementations the plurality of sensors may include three or more sensors. These may include one sensor located at a center of the substrate, one sensor located at a mid-radius of the substrate and edge. In some implementations, the sensor array may be sandwiched between first and second semiconductor wafers to provide noise isolation.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶ 6. In particular, the use of "step of" in the claims herein is not intended to invoke the provisions of 35 USC §112, ¶ 6.

What is claimed is:

1. A system, comprising:
an etch rate monitor apparatus having an optical element and one or more optical detectors mounted to a common substrate, wherein the one or more detectors are sandwiched between the substrate and the optical element;
wherein the optical element is made of a material that allows transmission of radiation of a wavelength of interest, and
wherein the one or more detectors are configured to detect changes in optical interference signal resulting from changes in optical thickness of the optical element;
wherein the etch rate monitor apparatus is configured to collect a reference waveform and a data waveform, cross-correlate the data waveform with the reference waveform by determining error terms from a plurality of reference intensity readings and data intensity readings a plurality of pixels corresponding to different sensors in an array of optical sensors, and determine an optical thickness change from the cross-correlating of the data with the reference waveform.

2. The system of claim 1, wherein the one or more optical detectors includes a plurality of optical detectors.

3. The system of claim 1, wherein the plurality of optical detectors includes three or more sensors.

4. The system of claim 3, wherein the three or more sensors include one sensor located at a center of the substrate, one sensor located at a mid-radius of the substrate and a sensor located at an edge of the substrate.

5. The system of claim 1, wherein the one or more detectors includes a linear array of sensors.

6. The system of claim 5, further comprising a computer system configured to process a data signal from the linear array of sensors against a reference signal from the linear array of sensors to create a time-varying autocorrelation function that further relates the data collected to an optical phase shift.

7. The system of claim 6, further comprising a computer that is separate from the etch rate monitor apparatus, wherein the computer is configured to analyze the autocorrelation function to generate uniformity maps as a function of time.

8. The system of claim 1, wherein the etch rate monitor apparatus further includes a wavelength filter provided between the optical element and the one or more detectors, which allows only radiation having wavelengths in a range of interest to pass through.

9. The system of claim 1, wherein the etch rate monitor apparatus further includes a collimator provided between the optical element and the detector, capable of producing a parallel beam of the light passing through the optical element.

10. The system of claim 1, wherein the etch rate monitor apparatus further includes a partial mirrored surface provided between the optical element and the detector, the partial mirrored surface being located on a side towards the detector.

11. The system of claim 1, wherein the data processing unit further includes a memory to store the data collected from the etch rate monitor apparatus.

12. The system of claim 1, wherein the optical element includes a wedge of sacrificial material having a known thickness variation that transmits light in a wavelength range of interest.

13. The system of claim 1, wherein the optical element includes a slab-shaped window.

14. The system of claim 13, further comprising partially reflecting mirrors on opposite sides of the window.

15. The system of claim 13, further comprising an optical filter on one side of the window.

16. The system of claim 14, wherein the partially reflecting mirrors include a partially reflecting mirror on one side of the window that is configured such that some light may pass through the window to part of one or more optical sensors without passing through the partially reflecting mirror on the one side of the window.

17. The system of claim 13, wherein the slab-shaped window includes one or more steps.

18. The system of claim 1, wherein the apparatus is configured to use an external environment as a source of the light of a wavelength of interest.

19. The system of claim 18, wherein the external environment includes a plasma that acts as the source of the light.

20. The system of claim 1, wherein the one or more optical sensors are sandwiched between first and second semiconductor wafers to provide noise isolation.

21. The system of claim 1, wherein the one or more optical sensors are configured to communicate wirelessly with a computing system.

22. A method, comprising:
obtaining a reference waveform and data waveform collected with an etch rate monitor apparatus, the apparatus comprising an optical element and one or more optical detectors mounted to a common substrate, wherein the one or more detectors are sandwiched between the substrate and the optical element, wherein the optical element is made of a material that allows transmission of radiation of a wavelength of interest, and wherein the one or more detectors are configured to detect changes in optical interference signal resulting from changes in optical thickness of the optical element;
cross-correlating the data waveform with the reference waveform by determining error terms from a plurality of reference intensity readings and data intensity readings a plurality of pixels corresponding to different sensors in an array of optical sensors; and
determining thickness change from the cross-correlating of the data with the reference waveform.

23. The method of claim 22, wherein cross-correlating the data waveform with the reference waveform includes determining a phase shift from the error terms.

24. The method of claim 22, wherein cross-correlating the data waveform with the reference waveform includes creating an autocorrelation function that relates data collected to an optical phase shift.

25. The method of claim 24, further comprising analyzing the autocorrelation function to generate uniformity maps as a function of time.

26. A non-transitory computer-readable medium having computer executable instructions embodied therein, the instructions being configured to implement a method, when executed, the method, comprising:
obtaining a reference waveform and data waveform collected with an etch rate monitor apparatus, the apparatus comprising an optical element and one or more optical detectors mounted to a common substrate, wherein the one or more detectors are sandwiched between the substrate and the optical element, wherein the optical element is made of a material that allows transmission of radiation of a wavelength of interest, and wherein the one or more detectors are configured to detect changes in optical interference signal resulting from changes in optical thickness of the optical element;
cross-correlating the data waveform with the reference waveform by determining error terms from a plurality of reference intensity readings and data intensity readings a plurality of pixels corresponding to different sensors in an array of optical sensors; and
determining thickness change from the cross-correlating of the data with the reference waveform.

* * * * *